United States Patent [19]
Galloway

[11] Patent Number: 5,539,848
[45] Date of Patent: Jul. 23, 1996

[54] OPTICAL WAVEGUIDE MODULE AND METHOD OF MAKING

[75] Inventor: David Galloway, Tempe, Ariz.

[73] Assignee: Motorola, Schaumburg, Ill.

[21] Appl. No.: 456,207

[22] Filed: May 31, 1995

[51] Int. Cl.$^6$ ................................................. G02B 6/36
[52] U.S. Cl. ..................................................... 385/89
[58] Field of Search ........................ 385/132, 49, 88–94, 385/14, 52, 126, 131

[56] References Cited

U.S. PATENT DOCUMENTS

| 5,271,083 | 12/1993 | Lebby et al. | 385/131 |
| 5,325,451 | 6/1994 | Hartman et al. | 385/132 |
| 5,367,593 | 11/1994 | Lebby et al. | 385/132 |

FOREIGN PATENT DOCUMENTS

| 20601 | 4/1982 | Japan | 385/132 |
| 61-26002 | 2/1986 | Japan | 385/132 |

*Primary Examiner*—John Ngo
*Attorney, Agent, or Firm*—Eugene A. Parsons

[57] ABSTRACT

A first cladding region (12) having a first surface and a second surface is formed. The first surface (18) having a first core region extending on the first surface (18) and the second surface (19) having a second core region extending on the second surface (19). A second cladding region (13) having a third surface (17) with the third surface (17) affixed on the first surface (18) of the first cladding region (12). A third cladding region (11) having a fourth surface (21) with the fourth surface (21) of the third cladding region (11) affixed to the second surface (19) of the first cladding region (12).

2 Claims, 4 Drawing Sheets

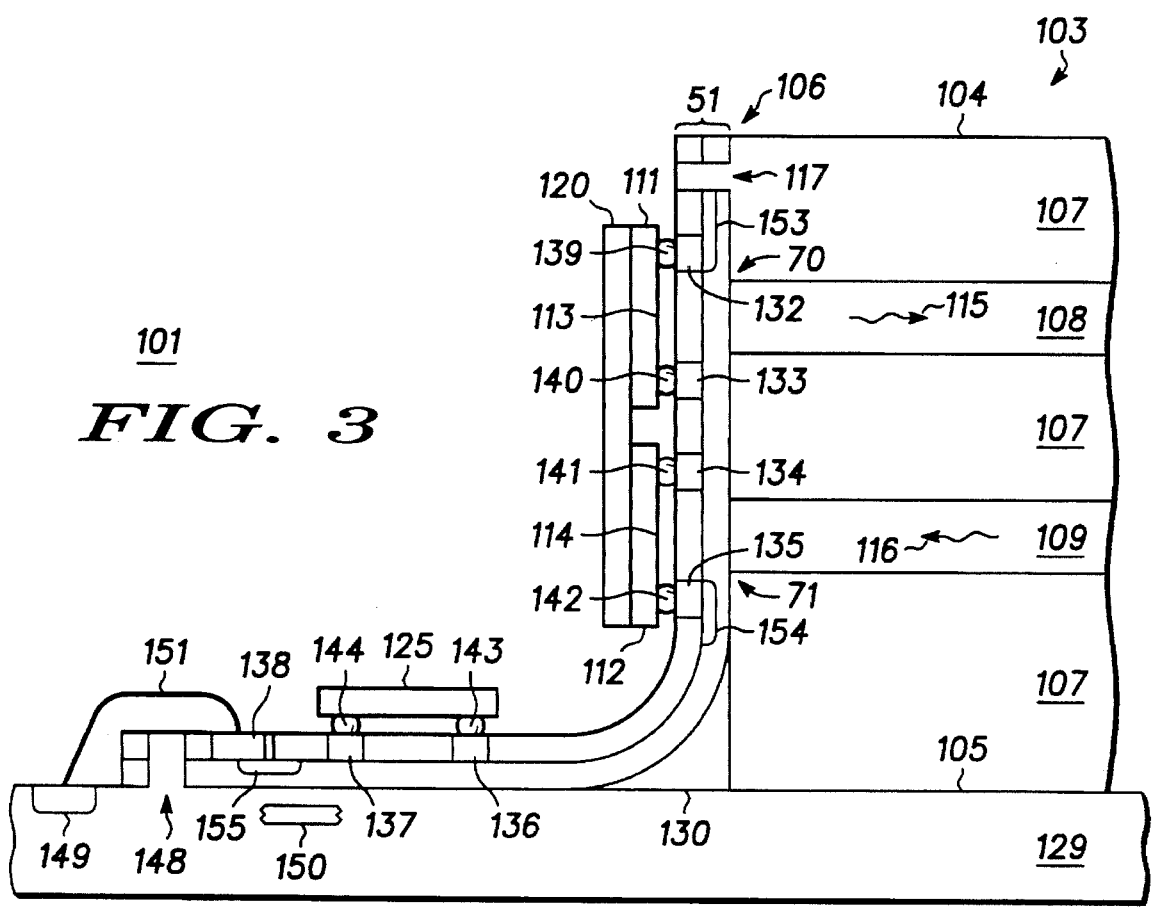

OPTICAL WAVEGUIDE MODULE AND METHOD OF MAKING

FIELD OF THE INVENTION

This invention relates, in general, to fabrication of optical devices and, more particularly, to interconnecting optical devices and waveguides together.

BACKGROUND OF THE INVENTION

This application is related to patents bearing U.S. Pat. Nos. 5,265,184 and 5,249,245, titled MOLDED WAVEGUIDE AND METHOD OF MAKING SAME and OPTOELECTRONIC MOUNT INCLUDING FLEXIBLE SUBSTRATE AND METHOD FOR MAKING SAME, issued on Nov. 23 and Sep. 28, 1993, respectively, which are hereby incorporated by reference herein.

Presently, coupling of an optical device, a waveguide, and an interconnect substrate is a difficult task that typically is achieved either manually or semiautomatically. However, these methods have several problems, such as being complex, being inefficient, and not suitable for high volume manufacturing. Since these problems limit high volume manufacturing, incorporation of optical devices with standard electronic components is a difficult task, thus not enabling advantages of optical devices to be incorporated with standard electronic components.

By way of example, conventional interconnection of an optical device and a waveguide typically is achieved by carefully aligning the optical device to the waveguide manually, commonly referred to as active alignment. Once the optical device is aligned to the waveguide, the optical device is affixed to the waveguide. However, several problems arise by aligning the optical device and the waveguide manually, such as being extremely labor intensive, being costly, and being inaccurate. Further, curing of an adhesive that affixes or binds the optical device to the waveguide often shift the alignment of the optical device to the waveguide, thereby causing inefficient transfer of light from the optical device. Moreover, if the misalignment is severe enough, unusable product is manufactured, thus increasing cost and reducing manufacturing capability.

Once the optical device and the waveguide have been aligned and affixed together, the optical device and waveguide are then mounted onto an interconnect substrate. However, mounting of the optical device and the waveguide to the interconnect substrate also has several problems, such as fragility of the fixed optical device and waveguide, alignment capability of the optical device and waveguide to the interconnect substrate, electrical coupling of the optical device, and the like, thus making the interconnection of the optical device, the waveguide, and the interconnect substrate unsuitable for high volume manufacturing.

It can readily be seen that conventional methods for interconnecting an optical device, a waveguide, and an interconnect substrate have severe limitations. Also, it is evident that conventional processes that are used to fabricate the interconnection between optical devices, waveguides, and interconnect substrates are not only complex and expensive, but nonamenable to high volume manufacturing. Therefore, an article and method for making interconnections between an optical device, a waveguide, and an interconnect substrate is highly desirable.

BRIEF DESCRIPTION OF THE DRAWINGS

FIG. 3 is a greatly enlarged simplified sectional view of an optical waveguide module;

DETAILED DESCRIPTION OF THE DRAWINGS

Figure 1:
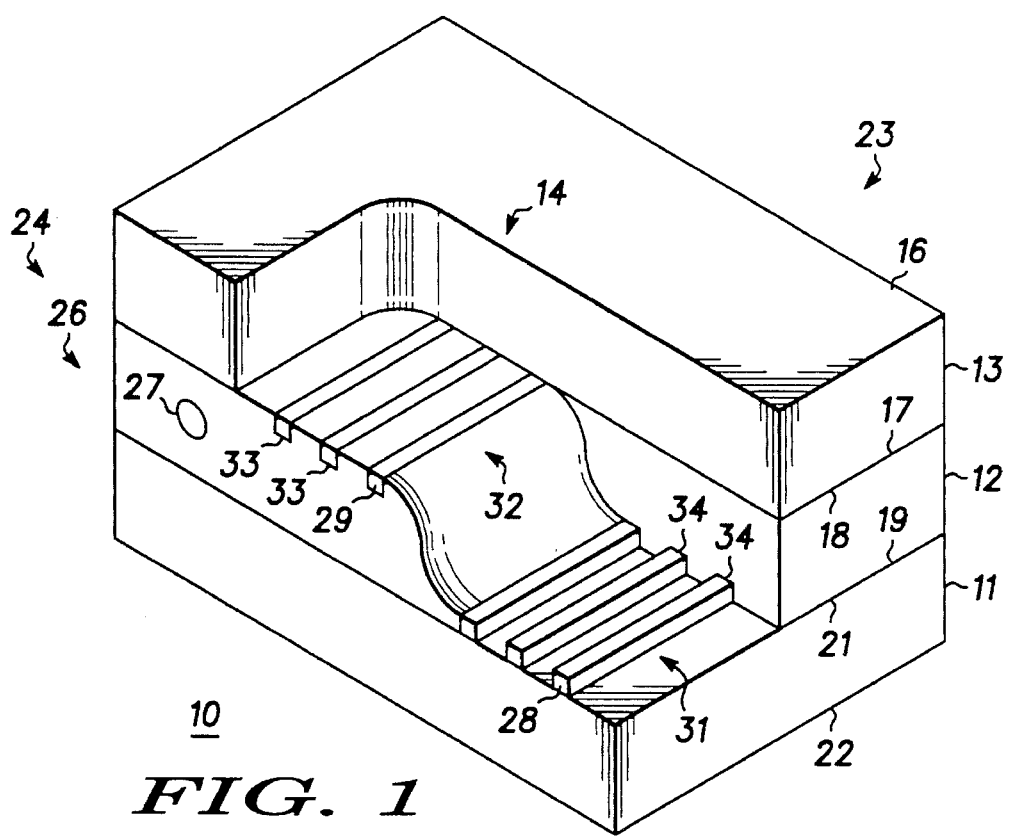
FIG. 1 a greatly enlarged simplified isometric view of a waveguide, with a portion thereof removed.

FIG. 1 illustrates an enlarged simplified isometric view of a waveguide 10, with a portion 14 thereof removed. For the sake of clearly illustrating the present invention, dimensional control and relative sizing of waveguide 10 have been relaxed.

Waveguide 10 is made of several elements or features, including cladding regions 11, 12, and 13, ends 23 and 24, a plurality of core regions 31 and 32, and an alignment guide 26. Cladding regions 11, 12, and 13 further include surfaces 21 and 22, 18 and 19, and 16 and 17, respectively. As can be seen in FIG. 1, with portion 14 of waveguide 10 removed, the plurality of core regions 31 and 32 is viewed with greater clarity. Additionally, it should be pointed out that the plurality of core regions 31 and 32 are surrounded by cladding regions 11 and 12 and 13 and 12, respectively.

Generally, cladding regions 11, 12, and 13 and the plurality of core regions 31 and 32 are made by any suitable method or technique, such as milling, molding, laser ablating, filling, or the like. Referring specifically to cladding regions 11, 12, and 13, in a preferred embodiment of the present invention, cladding regions 11, 12, and 13 are made by any suitable molding method or technique, such as injection molding, transfer molding, or the like. Whereas, in preferred embodiment of the present invention, the plurality of core regions 31 and 32 is made by any suitable filling technique or method, such as press filling, capillary filling, hydraulic injection, or the like.

Further, cladding regions 11, 12, and 13 and the plurality of core regions 31 and 32 are made of any suitable polymer material or combination of materials, such as plastics, epoxies, polyimides, polyvinyl, or the like. However, in a preferred embodiment of the present invention, cladding regions 11, 12, and 13 and the plurality of core regions 31 and 32 are made of an epoxy material. Typically, processing conditions for these materials range from 22–400 degrees Celsius for molding temperatures and 200–2,000 pounds per square inch for molding pressures. Refractive indexes for these materials range from 1.3 to 1.8, with a preferred range from 1.4 to 1.7; however, the plurality of core region have a higher refractive index than cladding regions 11, 12, and 13.

Cladding regions 11, 12, and 13 are form so that cladding regions 11, 12, and 13 are stackable, thereby forming the plurality of core regions 31 and 32 surrounded by cladding regions 11, 12, and 13.

Further, alignment guide 26 is made by any suitable method, such as molding, milling, laser ablating, or the like. As shown in FIG. 1, alignment guide is illustrate as a ferule; however, it should be understood that alignment guide 26 can be any suitable shape, such as pins, keys or ways, or the like.

After molding of cladding regions 11, 12, and 13, cladding regions 11 and 13 are affixed to cladding region 12 by an optical adhesive. Generally, the optical adhesive is applied to either surface 18 or surface 17. Cladding regions 12 and 13 are pressed so that surface 17 and 18 are mated, thereby squeezing the optical adhesive throughout grooves 32 and adhering cladding regions 12 and 13. A similar procedure is followed for adhering cladding region 11 to cladding region 12. Thus, by forming, filling, and adhering cladding regions 11, 12 and 13, grooves 32 and 33 become the plurality of core regions 31 and 32 with cladding regions 11, 12, and 13 surrounding the plurality of core regions 31 and 32. Additionally, it should be understood that grooves 33 and 34 can be formed on cladding regions 11 and 13 and subsequently adhered to cladding region 12.

Figure 2:
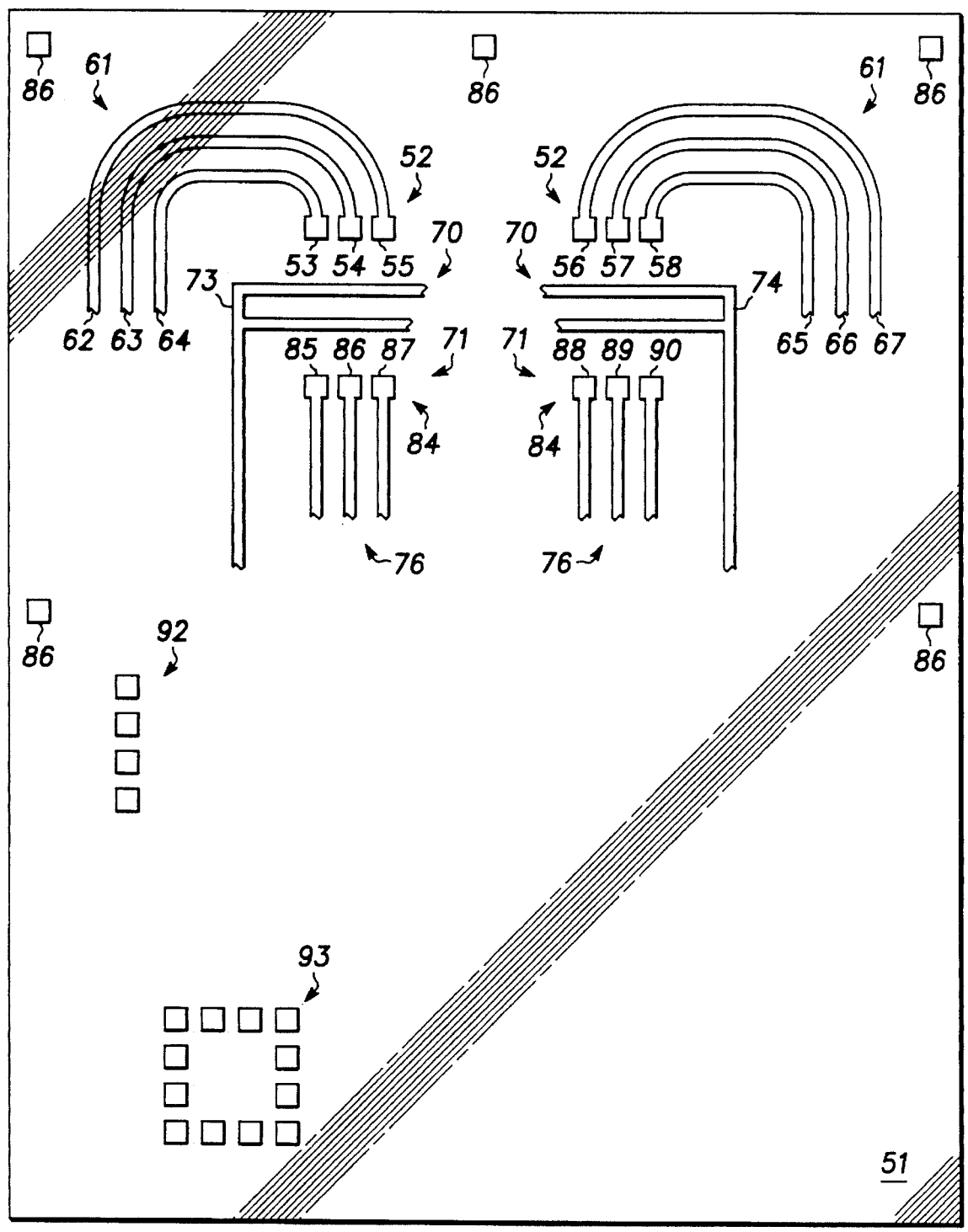
FIG. 2 is a greatly enlarged simplified partial plan view of an example of a flexible substrate.

Referring now to FIG. 2, a simplified example of a partial layout for a flexible substrate 51. Flexible substrate 51 is made of several elements or features, such as a plurality of bonding pads 52 including bonding pads 53–58, a plurality of electrical traces 61 including electrical traces 62–67, optically clear regions 70 and 71, electrical traces 73 and 74, a plurality of electrical traces 76 including electrical traces 77–82, a plurality of bonding pads 84, and alignment guides 86.

Generally, the plurality of electrical traces 61 and 76, the plurality of bonding pads 52 and 84, and electrical traces 73 and 74 illustrate paths for electrical signals to travel throughout flexible substrate 51. It should be further understood that these electrical paths can be patterned in any suitable configuration on or in flexible substrate 51, thereby enabling electrical signals to be passed throughout flexible substrate 51. Typically, electrical control signals are carried by the plurality of electrical traces 61 and 76 to the plurality of bonding pads 52 and 84, while electrical traces 73 and 74 provide a ground.

Flexible substrate 51 is made by any suitable method or technique. For example, flexible substrate 51 is made from any thin insulative material, such as those suitable for tape automated bonding (TAB) backing layer or substrate. Polyimide is a representative material, but is certainly not the only one; polyimide may be found under tradenames such as "UPLEX" or "KAPTON", among others. Other suitable materials include, but are not necessarily limited to, polyester materials (lower in cost and performance that polyimide), mylar materials, and composite materials, e.g., a resin filled epoxy, a fiber reinforced material, and the like.

The plurality of electrical traces 61 and 76, the plurality of bonding pads 52 and 84, and electrical traces 73 and 74 are formed by any suitable method, such as but not limited to plating, etching, photolithography, printing, etc. Typically, the plurality of electrical traces 61 and 76, the plurality of bonding pads 52 and 84, and electrical traces 73 and 74 are made of suitable electrically conductive material, such as a metal, e.g., aluminum (Al), titanium (Ti), copper (Cu), tungsten (W), silver (Ag), a metal alloy, e.g., titanium/tungsten (TiW), aluminum/copper (Al/Cu), an electrically conductive adhesive, e.g., silver filled epoxy, gold filled epoxy, copper filled epoxy, or the like. Adhesion of the plurality of electrical traces 61 and 76, the plurality of bonding pads 52 and 84, and electrical traces 73 and 74 to flexible substrate 51 is such that they will not delaminate or separate from flexible substrate 51 when flexible substrate 51 is bent or positioned in subsequent processing.

Additionally, materials selected for fabrication of insulative flexible substrate 51 generally are temperature resistant. For example, in most applications, flexible substrate 51 will undergo an overmolding process. Temperatures and times of duration of the overmolding process typically range from 200–300 degrees Celsius with time ranges from 10–15 minutes. Thus, material selected for fabrication of flexible substrate 51 needs to be able to tolerate these temperatures and times. However, it should be evident that materials that exceed these requirements or performance levels, are also usable. While several manufacturers are capable of supplying flexible substrate 51, purchase of flexible substrate 51 is available from Rogers Corporation located in Arizona.

Windows 70 and 71 are formed by any suitable method, such as removing a portion, corresponding to windows 70 and 71, from flexible substrate 51, making a portion, corresponding to windows 70 and 71, transparent, thereby providing an optically clear area in flexible substrate 51.

The plurality of bonding pads 92 and 93 illustrate an ability for electrical coupling, i.e., electrical input and electrical output to flexible substrate 51. With reference to the plurality of bonding pads 92, electrical coupling is achieved by any suitable method or technique, such as wire bonding, bump bonding, or the like. With reference to the plurality of bonding pads 93, the plurality of bonding pads 93 illustrate a position where flexible substrate can be electrically coupled with standard electrical component, such as integrated circuits (ICs), resistors, capacitors, and the like.

Referring now to FIG. 3, FIG. 3 illustrates a greatly enlarged simplified sectional view of an optical waveguide module 101. It should be understood that similar feature and elements identified hereinabove will retain their original identifying numerals. Further, it should be understood that FIG. 3 is sectional view, thus the figure can extend into and out of the drawing.

Optical waveguide module 101 includes of several elements or features, such as an interconnect substrate 129 having surface 130, a waveguide 103, a flexible substrate 51, photonic devices 111 and 112 with working portions 113 and 114, heat dissipating device 120, integrated circuit 125, interconnect substrate 129 having surface 130. Interconnect substrate 129 further includes an alignment device 148, bonding pad 149, and electrical trace 150. Waveguide 103 further includes surfaces 104 and 105, end surface 106, cladding regions 107 and core regions 108 and 109. Flexible substrate 51 also includes bonding pads 132–138 and corresponding conductive bumps 139–144.

Interconnect substrate 129 is made of any suitable substrate, such as a printed circuit board, a FR4 board, a ceramic interconnect board, or the like. It should be understood that interconnect substrate 129 can be configured into a wide variety of forms that allow further integration of optical devices with standard electrical components. Generally, interconnect substrate 129 enables additional electrical coupling between flexible substrate 51 to interconnect substrate 129, thereby further integrating photonic devices 111 and 112 with standard electrical components. Electrical coupling between interconnect substrate 129 and flexible substrate 51 is achieved by any suitable method or technique, such as wire bonding, bump bonding, tape assisted bonding (TAB), or the like. For the sake of simplicity and for illustrative purposes only, interconnect substrate 129 is coupled with flexible substrate 51 by a wire bond 151, thereby electrically coupling bonding pad 149 with bonding pad 138.

Electrical trace 150 is illustrated as only a single electrical trace; however, it should be understood that electrical trace 150 can be a plurality of electrical traces that travel throughout interconnect substrate 129, thereby providing conductive paths for electrical signals to travel throughout flexible substrate 51, thus enabling electrical coupling of interconnect substrate 129 to a wide range of standard electronic components and systems.

Generally, waveguide 103 as shown in FIG. 3 is fabricated in a similar manner as waveguide 10 shown in FIG. 1, wherein core regions 108 and 109 are surrounded by cladding region 107. However, it should be understood that waveguide 103 can also be made as having a single core region 108, as well as having a plurality of core region that are stacked on top or each other. In addition, FIG. 3 more clearly illustrates waveguide 103 in relation to other associated components of optical waveguide module 101. End surface 106 exposes a portion of core region 108, a portion of core region 109 and a portion of cladding region 107, thereby forming optical surfaces that light, indicated by arrows 115 and 116, can enter or leave waveguide 103. Additionally, alignment device 117 is formed on end surface 106. Alignment device 117 is formed by an suitable method or technique, such as a tab, an alignment fiducial, an opening, or the like. Generally, alignment device 117 is used to align flexible substrate 51 to waveguide 103, thereby optically coupling windows 70 and 71 to core regions 105 and 106.

Additionally, thermally conductive traces 153, 154 and 155 illustrates a method to remove heat from photonic devices 111. Thermally conductive trace 153 and 154 are fabricated adjacent to a high heat concentration, thereby allowing thermally conductive trace 153 and 154 to carry the heat away from the high heat concentration to low heat concentration. Generally, thermally conductive traces 153 and 154 are made of any suitable heat conductive material that is either electrically conductive or electrically nonconductive. For example, indium tin oxide is electrically nonconductive, while copper, tin/lead, palladium/nickel are both electrically conductive and heat conductive. However, it should be understood that use of either of these materials is application specific and care needs to be taken so as to cause electrical problems such as electrical shorting. For example, with thermally conductive traces 153 being coupled to bonding pad 138, the heat generated by photonic device 111 is carried away through thermally conductive traces 153 and 155 into interconnect substrate 129, thereby cooling photonic device 111 and improving performance of photonic devices 111.

Photonic devices 111 and 112 can be any suitable photonic device or combination of photonic devices. Typically, photonic devices 111 and 112 are photo-transmitters, a photo-receivers, or a combination thereof made by any suitable method or technique. For example, with photonic device 111 being an array of photo-transmitters, the photo-transmitters can be any suitable device, such as a vertical cavity surface emitting laser (VCSEL), light emitting diode (LED), or the like. Alternatively, with photonic device 112 being an array of photo-receivers, the photo-receivers can be any suitable photo-receiving device such as a photodiode, e.g., P-I-N photodiode, PN photodiode, or the like. Thus, photonic devices 111 and 112 can be a broad range of photo-active devices capable of transmitting and receiving.

Additionally, photonic devices 111 and 112 are represented with heat dissipating device 120. Heat dissipating device can be any suitable device, such as fins, heat sinks, heat dissipaters or the like that dissipates heat away from photonic devices 111 and 112. Heat dissipating device 120 typically are made of any suitable heat conductive material, such as a metal, e.g., aluminum, copper, gold, an alloy, e.g., aluminum/copper, silicon/aluminum, or the like, thereby enabling heat removal from photonic devices 111 and 112. By dissipating heat from photonic devices 111 and 112, photonic devices 111 and 112 have improved performance and long term reliability.

Electrical coupling of photonic devices 111 and 112 and integrated circuit 125 to flexible substrate 51 is accomplished by any suitable method or technique, such as wire bonding, TAB bonding, bump bonding, or the like. In a preferred embodiment of the present invention, bump bonding of photonic devices 111 and 112 and integrated circuit 125 is achieved by bump balls 139–142 and 143–144, respectively. However, in some applications, it should be understood that bonding methods can be mixed, e.g., photonic device being bump bonded and integrated circuit being wire bonded, thus enabling the bonding method to be varied in accordance with specific applications.

While integrated circuit 125 of FIG. 3 shows only a single integrated circuit, it should be understood that integrated circuit 125 represents a wide variety of standard electronic components, such as capacitors, resistors, discrete devices, and hybrid devices that can be located on flexible substrate 51, thereby enabling electrical signals to be processed by a wide variety of electronic devices.

Accurate placement or alignment of flexible substrate 51 to waveguide 103 and to interconnect substrate 129 is achieved by any suitable method or technique, such as mechanical, machine vision, or the like, as well as any combination thereof. Any suitable mechanical alignment method or technique, such as locks and keys, tabs and openings, or the like can be used. As shown in FIG. 3, alignment devices 117 and 148, represents by tabs and openings, engage openings and, thereby aligning flexible substrate 51 to both waveguide 103 and interconnect substrate 129. However, if the mechanical alignment technique is not robust enough for the specific application, then any other suitable alignment technique, such as a robotically controlled system that uses machine vision, or the like can be used. The machine vision can be further augmented by placing alignment fiducials or alignment features on any necessary surface of waveguide 103 flexible substrate 51, and interconnect substrate 129, thereby enabling reference points or alignment fiducials to be superimposed so as to provide precise specific alignment. Use of several different alignment fiducials and procedures, such as optical targets, position orientation, and openings and tabs are capable of achieving accurate placement of flexible substrate 51 to waveguide 103.

Affixing or attachment of flexible substrate 51 to waveguide 103 and to interconnect substrate 129 is achieved by any suitable method or technique, such as an adhesive, e.g., epoxy, polyimide, or any ultraviolet curable adhesive, or the like. Typically, flexible substrate 51 is positioned and affixed to waveguide 103 by a robotic arm or the like. For example, waveguide 103 can be held either by a jig on a table or held by a robotic arm (not shown). An optically transparent epoxy is applied to end surface 106. Flexible substrate 51 subsequently is applied to waveguide 103 by a robotic arm. Placement of flexible substrate 51 is aligned to waveguide 103 by any one of several alignment fiducial systems previously described. In yet another example, alignment device 117 is formed on end surface 106 of waveguide 103. Alignment device 117 is then recognized by a machine vision system which orients an opening in flexible substrate 51 to alignment device 117 and places the opening over alignment device 117, thus affixing flexible substrate 51 to waveguide 103.

Similarly, flexible substrate 51 is aligned and attached to interconnect substrate 129, thereby affixing a portion of flexible substrate 51 to interconnect substrate 129. However, it should be pointed out that electrical interconnection or operably coupling flexible substrate 51 to interconnect substrate 129 can be achieved by any suitable method such as wire bonding, bump bonding, tab bonding, or the like. However, as shown in FIG. 3, flexible substrate 51 is wire bonded from bonding pad 138 to bonding pad 149 through wire bond 151, thus electrically interconnecting interconnect substrate 129 with flexible substrate 51, thus operably coupling photonic devices 111 and 112 though flexible substrate 51 to interconnect substrate 129.

Figure 4:
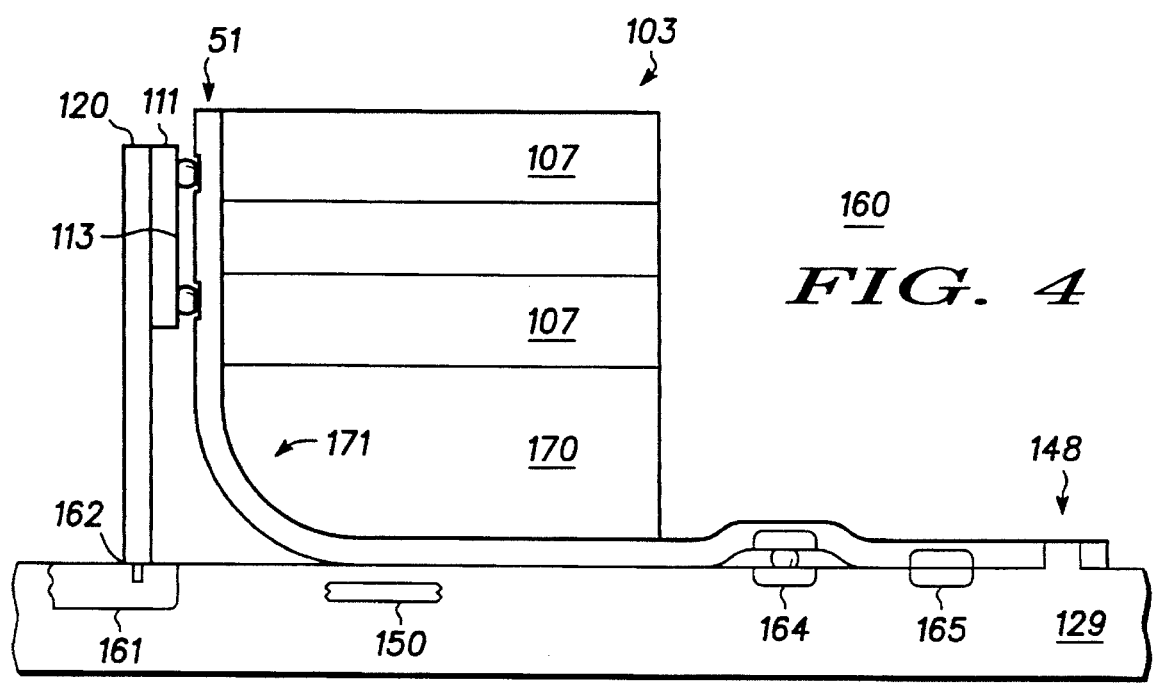
FIG. 4 is another greatly enlarged simplified sectional view optical waveguide module.

Referring now to FIG. 4, FIG. 4 is another greatly enlarged simplified sectional view of an optical waveguide module 160. It should be understood that similar features and elements identified hereinabove will retain their original identifying numerals. So as to more clearly illustrate the present invention, it should be understood that dimensions and relative sizing shown in FIG. 4 have been relaxed. Further, it should be understood that FIG. 4 is sectional view, thus the figure can extend into and out of the drawing.

Generally, optical waveguide module 160 has been described hereinabove; however, several additional elements are included in FIG. 4, a heat conducting trace 161 with mating surfaces 162, bonding pads 164 and 165, and a spacing body 170 with a curved surface 171. For the sake of simplicity, optical waveguide module 160 has be simplified.

Figure 5:
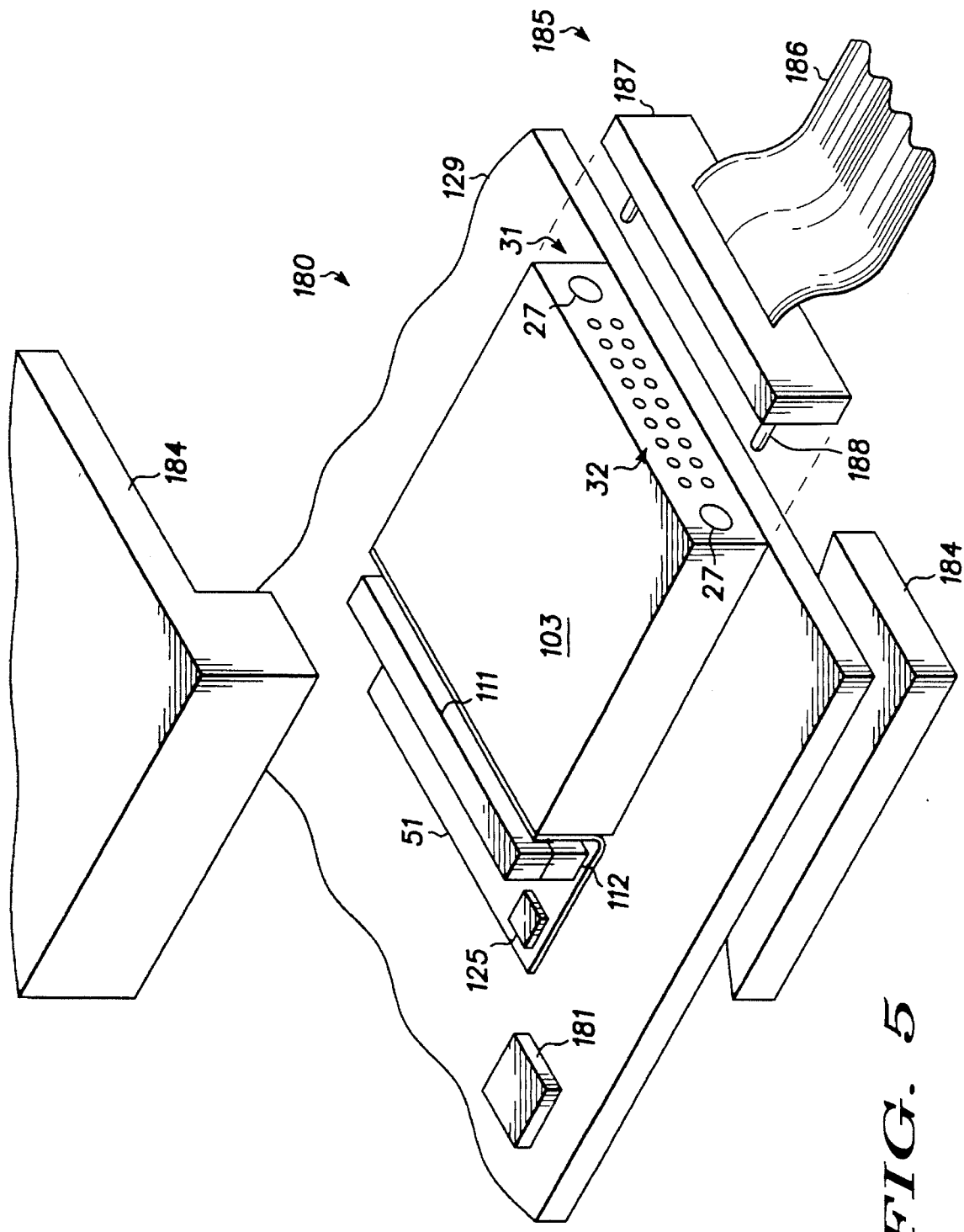
FIG. 5 is a greatly enlarged simplified sectional view of exploded view of an optoelectronic module.

Interconnect substrate 129 has been described hereinabove, with reference to FIG. 3, thus not necessitating a detailed description here. However, as shown in FIG. 5, heat conducting trace 161 is joined with heat dissipating device 120 with mating surfaces 162, thereby providing a heat conduction path from photonic device 111 into interconnect substrate 129, thereby improving performance and life time of photonic device 111. Mating surfaces 162 are made of portions of conducting trace 161 and heat dissipating device 120 in any suitable configuration, such as flat surfaces, tabs and openings, or the like, thereby providing a good mechanical and heat conducting joint or union.

Spacing body 170 provides a smooth transition from waveguide 103 to interconnect substrate 129 for flexible substrate 51, thereby reducing stress of flexible substrate 51 along curved surface 171. Spacing body 170 is made of any suitable plastic material, such as plastics, epoxies, polyimides, polyvinyl, or the like, thereby generating a smooth hard plastic material for flexible substrate 51 to transition to interconnect substrate 129. Additionally, spacing body 170 is formed by any suitable method, such as molding, milling, or the like. However in a preferred embodiment of the present invention, spacing body 170 is made by molding an epoxy material. Generally, spacing body 170 is sized the same as waveguide 103, thereby enabling waveguide 103 and spacing body 170 to be joined.

Generally, heat conducting device 120 is made of any suitable material, e.g., aluminum, copper, tin, or the like, as well as any suitable alloy, e.g., aluminum/copper, steel, or the like. Heat conductive device 120 is shaped to contact photonic device 111 and heat conducting trace 161. Generally, heat conduction device 120 is shaped with a flat surface that is mechanically affixed to photonic device 111 and to conducting trace 160. Affixing of heat conduction device 120 is achieved through any suitable method or technique, such as heat conductive epoxies, solder paste, press fitting, or the like. Thus, formed solid piece of metal of any suitable material FIG. 5 is a simplified partially exploded pictorial illustration of an optoelectronic module 180. It should be understood that elements or features previously described in FIGS. 1–4 will retain their original identifying numerals. Optoelectronic module 180 is made of several elements or features, such as interconnect substrate 129, waveguide 103 having a plurality of core regions 31 and 32, alignment ferrules 27, photonic devices 111 and 112, flexible substrate 51, integrated circuit 125, an integrated circuit 181, and plastic portions 184. Additionally, an optical connector 185 having an optical cable 186, body 187, and an alignment guide 188 is illustrated.

As illustrated in FIG. 5, waveguide 103 is operably coupled to photonic devices 111 and 112 through flexible substrate 51. Photonic devices 111 and 112 are illustrated as an array spanning the plurality of core regions 31 and 32. Typically, the array can be of any suitable configuration. For example, the array can be made of individual photonic devices that are assembled or the array can be made an entire unit. Devices incorporated into the array can be phototransmitters, photo-receivers, or any combination thereof. Photonic devices 111 and 112 is mounted to flexible substrate 51 so that working portions of photonic devices 111 and 112 are aligned to individual core regions of the plurality of core regions 31 and 32, thus providing maximum light transmission through waveguide 103.

Generally, waveguide 103 is attached to interconnect substrate 129 by any suitable method or technique such as adhering, press fitting, molding, or the like. However, in a preferred embodiment of the present invention, an epoxy adhesive is applied to interconnect substrate 129 at an appropriate location where waveguide 103 and interconnect substrate 129 are to be bonded. Waveguide 103 is subsequently placed into the adhesive by an automated system such as a robot arm (not shown), thereby providing accurate placement and orientation of waveguide 103.

Electrical coupling of standard electronic components, illustrated by integrated circuit 125, to flexible substrate 51 is achieved by any suitable method or technique, such as wire bonding, bump bonding, TAB, or the like. It should be understood that specific selection of electrical coupling is application specific.

Further, plastic encapsulation of interconnect substrate 129, waveguide 103, flexible substrate 51 is achieved by an overmolding process, represented by plastic portions 184. Plastic portions 184 encapsulate the above mentioned elements while leaving alignment ferrules 27 and the plurality of core regions 31 and 32 open and clear of debris. Thus, optical surfaces form optical cable 62 can be mated and aligned to the plurality of core regions 31 and 32 in waveguide 103.

By now it should be appreciated that a novel optoelectronic mount and method of making have been provided. The optoelectronic mount enables the incorporation of standard electronic components and optical components such that advantages of the optical components can be utilized. Further it should be noted that the method and article of the present invention allow this integration in a cost effective manner by providing a way of eliminating costly steps carried out by hand and to automate the remaining manufacturing steps thus making the entire process highly manufacturable.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An optical waveguide module comprising:

an interconnect substrate having a first plurality of electrical traces and a first plurality of bonding pads;

a waveguide with a first end, a second end, a first surface, a second surface, a core region, and a cladding region, the cladding region surrounds the core region and forms the first surface and the second surface, the first end exposes a first portion of the core region and a second portion of the cladding region with the second end exposes a third portion of the core region and a fourth portion of the cladding region;

a forming body having a first surface, a second surface, and a curved surface, the first surface of the forming body mated to the second surface of the waveguide with curved surface located at the first end of the waveguide;

a flexible tape having an optically clear portion, a second plurality of electrical traces, a second plurality of electrical bonding pads, and a third plurality of bonding pads, the optically clear portion of the flexible tape being operably coupled with the first portion of the core region of waveguide, the flexible tape being mated along the first end and the curved surface and along the second surface of the forming body and extending therefrom; and a photonic device having a working portion and a fourth surface, the working portion operably coupled to one of the first plurality of bonding pads of the flexible tape and the core region of the waveguide; and a heat dissipating device attached to the fourth surface of the photonic device, thereby making optical waveguide module.

2. An optical waveguide module as claimed in claim 1 further including a plastic portion, wherein the plastic portion encapsulates at least a portion of the waveguide.

* * * * *